(12) United States Patent
Muramoto

(10) Patent No.: US 11,139,342 B2
(45) Date of Patent: Oct. 5, 2021

(54) UV-LED AND DISPLAY

(71) Applicant: NITRIDE SEMICONDUCTORS CO., LTD., Tokushima (JP)

(72) Inventor: Yoshihiko Muramoto, Tokushima (JP)

(73) Assignee: NITRIDE SEMICONDUCTORS CO., LTD., Tokushima (JP)

( * ) Notice: Subject to any disclaimer, the term of this patent is extended or adjusted under 35 U.S.C. 154(b) by 0 days.

(21) Appl. No.: 16/509,053

(22) Filed: Jul. 11, 2019

(65) Prior Publication Data

US 2020/0098832 A1    Mar. 26, 2020

(30) Foreign Application Priority Data

Sep. 26, 2018  (JP) ............................. JP2018-181017
Oct. 24, 2018  (JP) ............................. JP2018-199891

(51) Int. Cl.
| | |
|---|---|
| *H01L 33/06* | (2010.01) |
| *H01L 33/32* | (2010.01) |
| *H01L 27/32* | (2006.01) |
| *H01L 33/50* | (2010.01) |
| *H01L 33/00* | (2010.01) |

(52) U.S. Cl.
CPC ...... *H01L 27/3211* (2013.01); *H01L 33/0025* (2013.01); *H01L 33/502* (2013.01)

(58) Field of Classification Search
CPC ..... H01L 27/0025; H01L 27/06; H01L 27/32; H01L 27/50; H01L 27/502; H01L 33/32; H01L 33/321; H01L 33/3211
USPC .......................................................... 257/89
See application file for complete search history.

(56) References Cited

U.S. PATENT DOCUMENTS

| | | | |
|---|---|---|---|
| 8,222,654 B2* | 7/2012 | Lee ....................... H01L 33/007 |
| | | | 257/94 |
| 2006/0131558 A1* | 6/2006 | Sato ........................ H01L 33/32 |
| | | | 257/17 |
| 2006/0175600 A1* | 8/2006 | Sato ........................ H01L 33/04 |
| | | | 257/14 |
| 2007/0290230 A1* | 12/2007 | Kawaguchi ............ B82Y 20/00 |
| | | | 257/196 |

(Continued)

FOREIGN PATENT DOCUMENTS

| | | |
|---|---|---|
| CN | 106033787 B | 5/2018 |
| EP | 1551063 A1 | 7/2005 |

(Continued)

OTHER PUBLICATIONS

Notice of Grounds for Rejection issued in counterpart Japanese Patent Application No. 2018-199891, dated Jan. 15, 2019 (4 Pages).

(Continued)

*Primary Examiner* — Fazli Erdem
(74) *Attorney, Agent, or Firm* — Osha Bergman Watanabe & Burton LLP

(57) ABSTRACT

A UV-LED is disclosed. The UV-LED includes a sapphire substrate, a u-GaN buffer layer formed on the sapphire substrate, an n-GaN contact layer formed on the u-GaN buffer layer, an InGaN light emitting layer formed on the n-GaN contact layer, and a p-GaN layer formed on the InGaN light emitting layer. The UV-LED has a quadrate planar shape with at least one side having a chip size of 50 μm or less.

6 Claims, 9 Drawing Sheets

(56) References Cited

U.S. PATENT DOCUMENTS

| | | | |
|---|---|---|---|
| 2012/0206671 A1* | 8/2012 | Takeuchi | C09K 11/7789 |
| | | | 349/69 |
| 2012/0313076 A1* | 12/2012 | Nakamura | H01L 33/0062 |
| | | | 257/13 |
| 2013/0069032 A1 | 3/2013 | Kushibe et al. | |
| 2013/0126891 A1 | 5/2013 | Bibl et al. | |
| 2013/0230938 A1 | 9/2013 | Kang et al. | |
| 2014/0103355 A1 | 4/2014 | Kusunoki et al. | |
| 2016/0064611 A1 | 3/2016 | Choi et al. | |
| 2016/0197232 A1 | 7/2016 | Bour et al. | |
| 2017/0069793 A1* | 3/2017 | Saito | H01L 33/12 |
| 2018/0211940 A1* | 7/2018 | Henry | H01L 33/60 |
| 2019/0225879 A1 | 7/2019 | Doi et al. | |
| 2019/0244937 A1 | 8/2019 | Honjo et al. | |

FOREIGN PATENT DOCUMENTS

| | | |
|---|---|---|
| JP | 2004-055719 A | 2/2004 |
| JP | 2004-186509 A | 7/2004 |
| JP | 2004-363349 A | 12/2004 |
| JP | 2005-197292 A | 7/2005 |
| JP | 2005-311119 A | 11/2005 |
| JP | 2010-103429 A | 5/2010 |
| JP | 2015-500562 A | 1/2015 |
| JP | 2017-017265 A | 1/2017 |
| JP | 2018-505567 A | 2/2018 |
| KR | 10-2016-0013552 A | 2/2016 |
| KR | 10-2018-0053864 A | 5/2018 |
| TW | 2004038668 A | 3/2004 |
| TW | 201611356 A | 3/2016 |
| TW | 201815970 A | 5/2018 |
| WO | 2011/027511 A1 | 3/2011 |
| WO | 2017/150257 A1 | 9/2017 |

OTHER PUBLICATIONS

Anis Daami et. al.;"Electro-optical size-dependence investigation in GaN micro-LED devices"; Université Grenoble Alpes, CEA-LETI, MINATEC Campus, Grenoble, France; 2018 (4 Pages).

MICROLED-info; "Micro LED Forum 2018"; Taipei, Taiwan, Jul. 12, 2018 (21 Pages).

Extended European Search Report issued in corresponding European patent application No. 19185578.2, dated Jan. 30, 2020 (8 pages).

Office Action issued in corresponding Taiwan Patent Application No. 108124528, dated Feb. 6, 2020 (7 pages).

Office Action issued in Taiwanese Application No. 108124528; dated Jun. 16, 2021 (7 pages).

* cited by examiner

UV-LED AND DISPLAY

CROSS REFERENCE TO RELATED APPLICATIONS

This application claims priority to Japanese Patent Application Nos. 2018-181017 filed on Sep. 26, 2018, and 2018-199891 filed on Oct. 24, 2018. These applications are hereby incorporated by reference in their entirety including the specification, claims, drawings, and abstract.

TECHNICAL FIELD

The present disclosure relates to a UV-LED and a display.

BACKGROUND

With an improvement in output and efficiency of UV-LEDs which emit light in the ultraviolet region, UV-LEDs are used as substitutes for UV lamps, and application of UV-LEDs is expanding to a wide variety of fields. Examples of the substitutes include high-resolution light sources such as microscopes and exposure machines; chemical excitation light sources used for light-curing of resin and medical biology; spectral excitation light sources used for bank bill recognition, DNA chips, and environmental measurement; and light sources for hygienic purposes such as sterilization and disinfection. Besides these examples, UV-LEDs are used as phosphor excitation light sources such as illumination and displays.

Particularly, in the application as displays, micro LED displays are attracting attention as next-generation displays following organic ELs, which have disadvantages in lifetime and temperature rise. Currently, the following three techniques have been developed predominately: the 3 LED method to which three types of LED chips; that is, red, blue, and green are applied; the blue LED method in which red and green phosphors are excited by a blue LED; and the UV-LED method in which red, green, and blue phosphors are excited by a UV-LED.

WO 2011/027511 discloses a liquid crystal display device which includes an ultraviolet LED; a green phosphor selected from trivalent cerium- or terbium-activated rare earth boride phosphors; a blue phosphor selected from divalent europium-activated halophosphate phosphors or divalent europium-activated aluminate phosphors; and a red phosphor selected from europium-activated lanthanum oxysulfide phosphors or europium-activated yttrium oxysulfide phosphors.

Among the aforementioned three techniques, the UV-LED method has an advantage in that the method hardly affects emission colors, offers high color reproducibility due to high excitation efficiency, and facilitates color balance and synchronization, which leads to easy control. However, the UV-LED method is still not satisfactory in luminous efficiency.

SUMMARY

An object of the present disclosure is to provide a technique for UV-LEDs that enables further improvement in luminous efficiency and reduces a rate of power output decrease when current density increases.

A UV-LED according to the present disclosure includes a buffer layer, a contact layer formed on the buffer layer, a light emitting layer formed on the contact layer, and a patterned sapphire substrate on which the buffer layer is formed. The UV-LED has a quadrate planar shape with at least one side having a chip size of 50 μm or less. In an embodiment of the present disclosure, the light emitting layer may be an InGaN light emitting layer.

A display according to the present disclosure includes the UV-LED; a red phosphor excited by light from the UV-LED; a green phosphor excited by light from the UV-LED; and a blue phosphor excited by light from the UV-LED.

According to the present disclosure, it is possible to further improve luminous efficiency and to reduce a rate of power output decrease when current density increases.

BRIEF DESCRIPTION OF DRAWINGS

Embodiment(s) of the present disclosure will be described by reference to the following figures, wherein.

DESCRIPTION OF EMBODIMENTS

Embodiment(s) of the present disclosure will now be described with reference to the drawings.

Figure 1A:
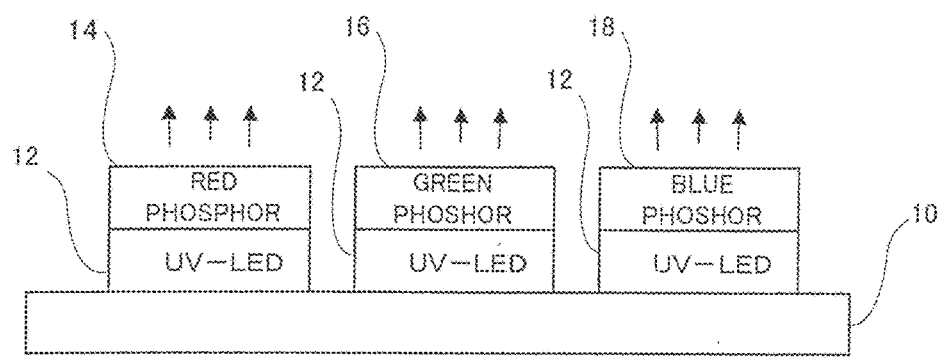
FIG. 1A is a view illustrating the principle of a display according to an embodiment.

FIG. 1A illustrates the principle a UV-LED display according to this embodiment. A plurality of UV-LED chips 12 are formed on a base 10, and a red phosphor 14, a green phosphor 16, and a blue phosphor 18 are stacked on the UV-LED chips 12. The red phosphor 14 is, for example, LOS:Eu; the green phosphor 16 is, for example, BAM:Eu, Mn; and the blue phosphor 18 is, for example, BAM:Eu, but the present disclosure is not limited thereto. Herein, LOS represents $La_2O_2S$, and BAM represents $(Ba, Mg) Al_{10}O_{17}$.

Figure 1B:
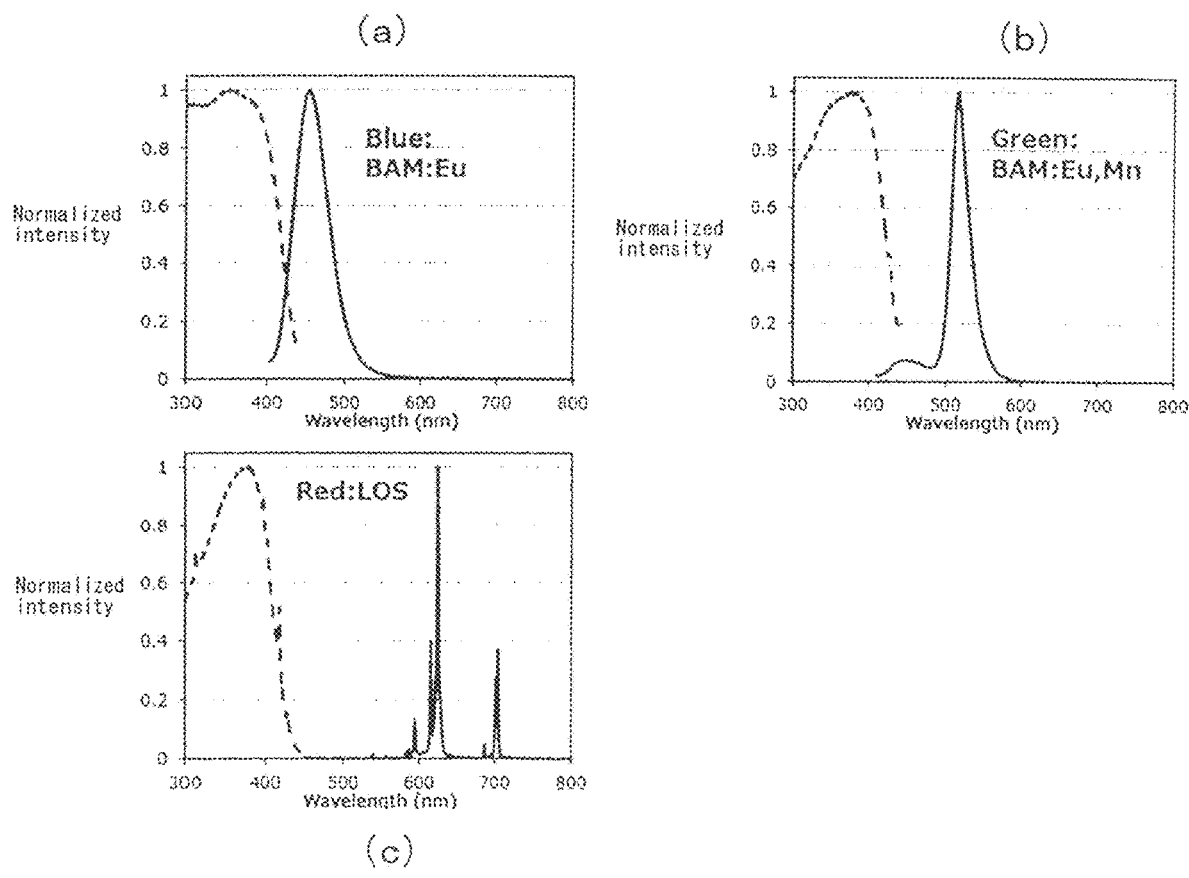
FIG. 1B illustrates emission spectra of phosphors according to the embodiment.

FIG. 1B illustrates emission spectra of the red phosphor 14, the green phosphor 16, and the blue phosphor 18. In FIG. 1B, (a) illustrates an emission spectrum of the blue phosphor 18, (b) illustrates an emission spectrum of the green phosphor 16, and (c) illustrates an emission spectrum of the red phosphor. Note that each broken line represents a spectrum of excitation light and that each solid line represents the emission spectrum.

The UV-LED chips 12 of practical use have a chip size of about 250 μm to 2 mm. The UV-LED chips 12 are mounted on a CAN package, a surface mount device (SMD) package, or directly on a substrate. A rated current is about 20 mA to 1 A, and luminous efficiency is over 50% at 365 nm but is still not satisfactory.

Accordingly, the inventors have focused on the wavelength and chip size of the UV-LED chips 12. In this embodiment, the wavelength and chip size of a UV-LED are optimized to achieve further improvement in luminous efficiency of the UV-LED and to reduce a rate of power output decrease when current density increases.

Figure 2:
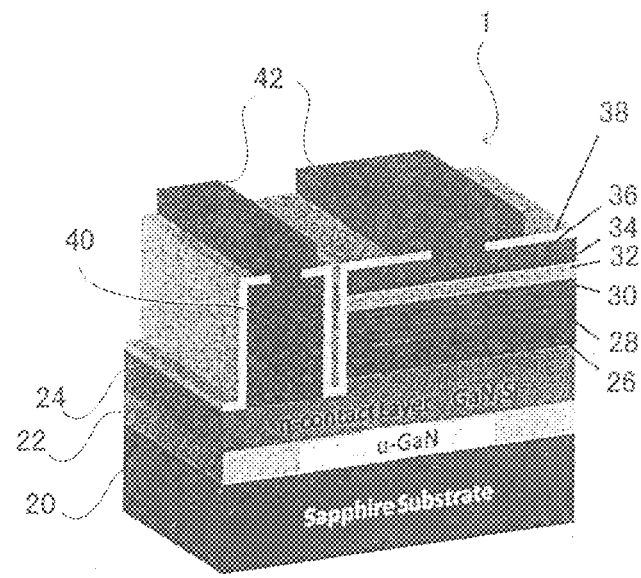
FIG. 2 illustrates an arrangement of a 385 nm UV-LED chip according to the embodiment.
Figure 3:
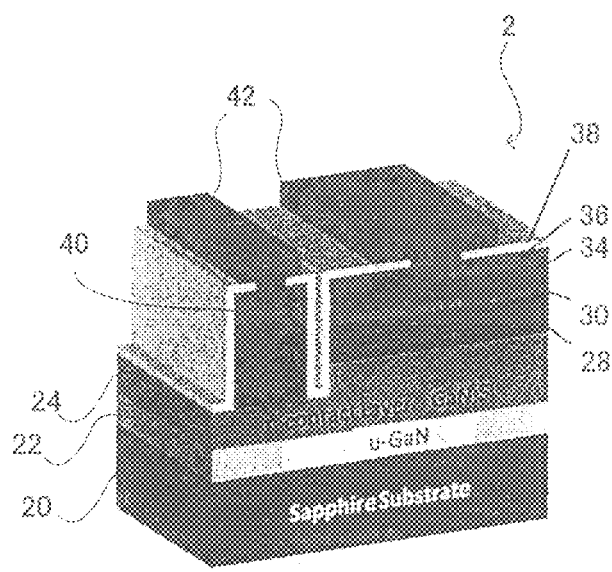
FIG. 3 illustrates an arrangement of a 400 nm UV-LED chip according to the embodiment.

FIG. 2 and FIG. 3 each illustrate an arrangement of a UV-LED chip in this embodiment. FIG. 2 illustrates a UV-LED chip 1 having an emission wavelength of 385 nm, and FIG. 3 illustrates a UV-LED chip 2 having an emission wavelength of 400 nm.

In FIG. 2, the UV-LED chip having an emission wavelength of 385 nm is obtained by stacking a u-GaN buffer layer 22 and a (GaN;Si) n-contact layer 24 on a sapphire substrate 20 and by stacking an InGaN light emitting layer thereon. Specifically, an (AlInGaN)/(InGaN;Si) n-superlattice structure (SLS) layer 26, an (InGaN/AlGaN) multiple quantum well (MQW) light emitting layer 28, a p-AlGaN;Mg layer 30, an (AlGaN;Mg/GaN;Mg) p-SLS layer 32, and a p-GaN (GaN;Mg) layer 34 are stacked in order, using an MOCVD apparatus. Herein, for example, (GaN;Si) represents Si-doped GaN. Furthermore, an ITO 36 is vapor-deposited by remote plasma deposition (RPD), an n-pad layer 40 and an under barrier metal (UBM) 42 are vapor-deposited by electron beam (EB), and an $SiO_2$ layer 38 is vapor-deposited by plasma-enhanced chemical vapor deposition (PECVD). More specifically, the u-GaN buffer layer 22 includes a low-temperature u-GaN layer and a high-temperature u-GaN layer, and the u-GaN buffer layer 22 is also referred to as an underlayer or a buffer coat.

Meanwhile, in FIG. 3, the UV-LED chip having an emission wavelength of 400 nm is obtained by stacking a u-GaN buffer layer 22 and a (GaN;Si) n-contact layer 24 on a sapphire substrate 20, and on the resulting laminate, an (InGaN/AlGaN) MQW light emitting layer 28, a p-AlGaN;Mg layer 30, and a p-GaN (GaN;Mg) layer 34 are stacked in order, using the MOCVD apparatus. An ITO 36 is vapor-deposited by remote plasma deposition (RPD), an n-pad layer 40 and an under barrier metal (UBM) 42 are vapor-deposited by electron beam (EB), and an $SiO_2$ layer 38 is vapor-deposited by plasma-enhanced chemical vapor deposition (PECVD).

The 385 nm and the 400 nm chips are similar in basic epitaxial structure, but with regard to the (InGaN/AlGaN) MQW light emitting layer 28 in the 385 nm chip, from a relationship of the band gap energy, the Al content is higher and the In content is smaller than those of the (InGaN/AlGaN) MQW light emitting layer 28 in the 400 nm chip. In addition, an In composition of the (InGaN/AlGaN) MQW light emitting layer 28 is about 8% in the chip having an emission wavelength of 385 nm and about 15% in the chip having an emission wavelength of 400 nm. To increase n and p carriers, the chip having an emission wavelength of 385 nm is provided with the superlattice structure (SLS) layers 26 and 32. The following values are a composition ratio and a film thickness of each layer in the UV-LED chips having an emission wavelength of 385 nm or 400 nm.

<385 nm> u-GaN layer: 3.2 μm (GaN;Si) n-contact layer: 2.7 μm $(Al_{0.20}In_{0.01}Ga_{0.79}N)/(In_{0.01}Ga_{0.99}N;Si)$ n-superlattice structure (SLS) layer: 1.5 nm/1.5 nm×50 pairs $(In_{0.08}Ga_{0.92}N/Al_{0.20}Ga_{0.80}N)$ multiple quantum well (MQW) light emitting layer 1.8 nm/15 nm×3 pairs p-$Al_{0.25}Ga_{0.75}N$ layer: 20 nm $(Al_{0.20}Ga_{0.80}N;Mg)/(GaN;Mg$ layer) p-superlattice structure (SLS) layer: 0.8 nm/0.8 nm×30 pairs p-GaN layer: 25 nm ITO layer: 100 nm $SiO_2$ layer: 500 nm <400 nm> u-GaN layer: 3.2 μm (GaN;Si) n-contact layer: 2.7 μm $(In_{0.15}Ga_{0.85}N/Al_{0.10}Ga_{0.90}N)$ multiple quantum well (MQW) light emitting layer: 2.0 nm/15 nm 3 pairs p-$Al_{0.20}Ga_{0.80}N$ layer: 20 nm p-GaN layer 25 nm ITO layer: 100 nm $SiO_2$ layer: 500 nm In this embodiment, flip chips of eight totally different sizes are fabricated to optimize the chip size in such an epitaxial structure in consideration of influences of the chip size. Herein, each flip chip is fabricated by undergoing a step of separation in which the MQW light emitting layer 28 and the p-GaN layer 34 are formed and then the sapphire substrate 20 is etched. Then, each flip chip undergoes MESA, formation of the n-pad layer 40, formation of the $SiO_2$ passivation layer 38, and formation of the under barrier metal (UBM) 42.

Figure 4:
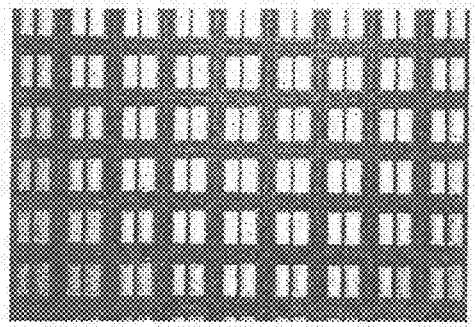
FIG. 4 illustrates square flip chips according to the embodiment.
Figure 5:
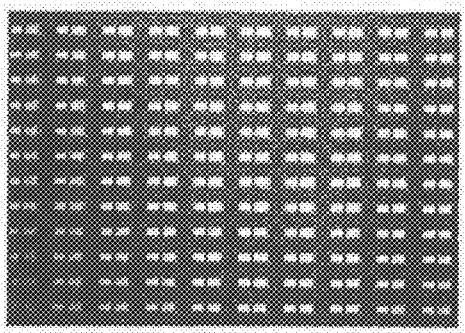
FIG. 5 illustrates rectangular flip chips according to the embodiment.

FIGS. 4 and 5 are photographs of flip chips in plan view. FIG. 4 illustrates flip chips having a square planar shape, and FIG. 5 illustrates flip chips having a rectangular planar shape. With regard to the flip chips having a square planar shape, <Square>

24 μm×24 μm

48 μm×48 μm

72 μm×72 μm

144 μm×144 μm

288 μm×288 μm flip chips of these five different sizes are fabricated. With regard to the flip chips having a rectangular planar shape, <Rectangle>

12 μm×48 μm

24 μm×48 μm

24 μm×72 μm flip chips of these three different sizes are fabricated.

With regard to the flip chips of eight different sizes fabricated for each of the 385 nm and the 400 nm chips, emission spectra and intensities are measured with a prober, and also, shifts in voltage relative to an injection current (I-V characteristics) and shifts in luminous intensity relative to an injection current (I-L characteristics) are measured.

Figure 6:
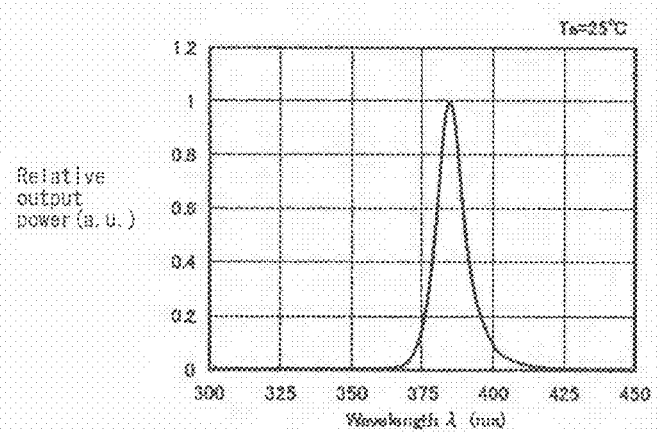
FIG. 6 illustrates an emission spectrum of a 385 nm chip according to the embodiment.

FIG. 6 illustrates an emission spectrum when an IF (forward current): 278 µA is applied to a 24 µm×24 µm chip or the minimum area of the 385 nm chip. The emission wavelength is 384.72 nm, and the half-value width is 10.25 nm, which indicates a normal spectral waveform.

Figure 7:
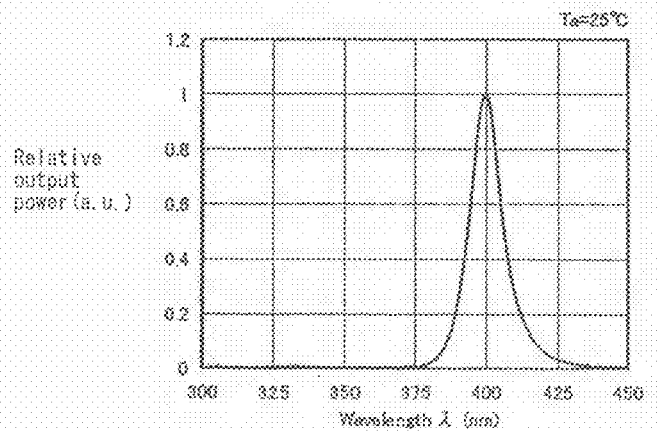
FIG. 7 illustrates an emission spectrum of a 400 nm chip according to the embodiment.

FIG. 7 illustrates an emission spectrum when an IF (forward current): 278 µA is applied to a 24 µm×24 µm chip or the minimum area of the 400 nm chip. The emission wavelength is 400.7 nm, and the half-value width is 12.26 nm, which also indicates a normal spectral waveform.

Figure 8:
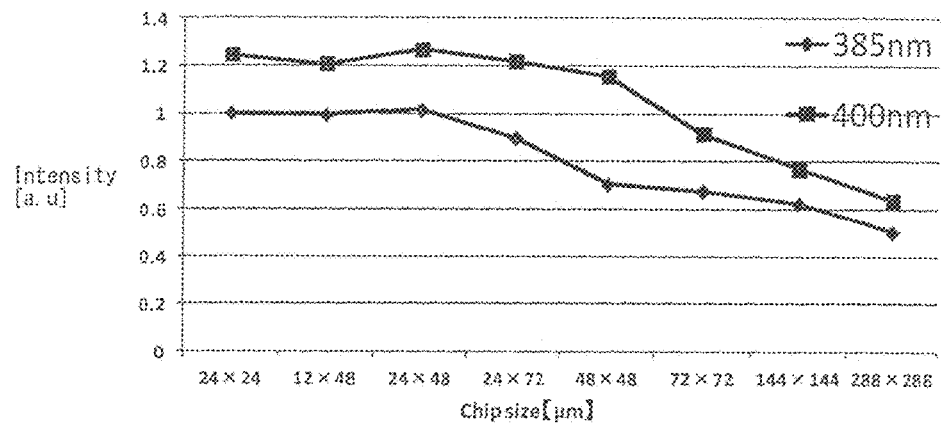
FIG. 8 illustrates luminous intensities of the 385 nm chips and the 400 nm chips according to the embodiment.

FIG. 8 illustrates results of luminous intensities of the 385 nm chips and the 400 nm chips measured at rated current density of 25.5 (A/cm$^2$). In the figure, the chip size is taken along the horizontal axis, and the luminous intensity (a.u.) is taken along the vertical axis.

In all the chip sizes, the luminous intensity and the luminous efficiency are higher in the 385 nm chips than in the 400 nm chips. In addition, in both chips having a wavelength of 385 nm or 400 nm, the luminous intensity tends to increase with a reduction in the chip size. Particularly, with regard to the 385 nm chips, the luminous intensity markedly improves with a chip size of 24 µm×72 µm or less, and with regard to the 400 nm chip, the luminous intensity markedly improves with a chip size of 48 µm×48 µm or less. As described above, the chip size in the related art is about 250 µm to 2 mm Therefore, the aforementioned chip sizes are prominently smaller than the chip size in the related art, which allows us to call them microchip sizes. The reason why the luminous intensity and the luminous efficiency prominently improve in micro-sized chips is that a chip with a smaller size has a shorter distance of a diffusion current, and causes an increase in emission recombination and an improvement in internal quantum efficiency. Furthermore, a chip with a smaller size has a shorter distance by which light emitted from a light emitting layer due to emission recombination is taken to the outside, and produces an improvement in extraction efficiency.

Figure 9:
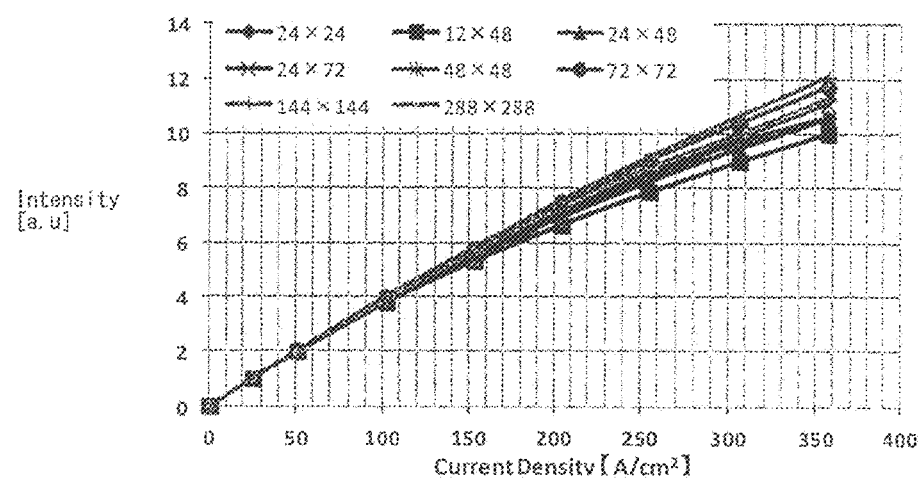
FIG. 9 illustrates I-L characteristics of the 385 nm chips according to the embodiment.
Figure 10:
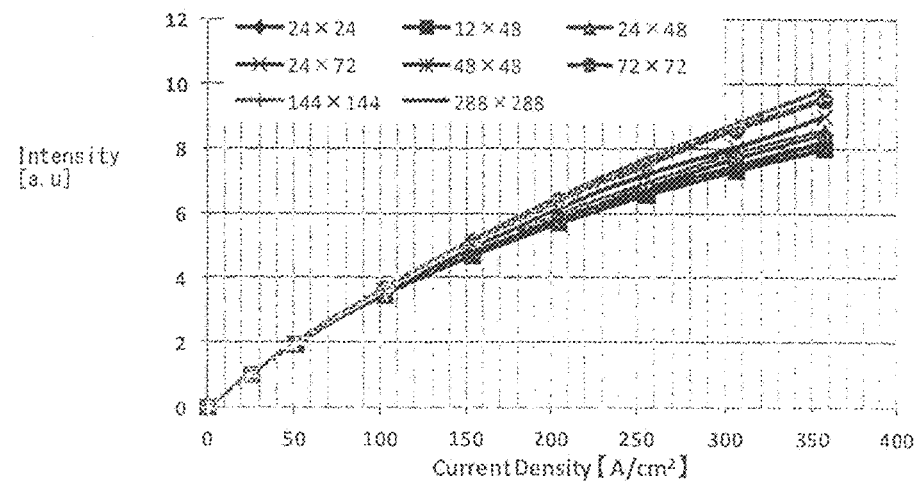
FIG. 10 illustrates I-L characteristics of the 400 nm chips according to the embodiment.

FIGS. 9 and 10 illustrate I-L characteristics when a current is applied to the chips of eight different sizes fabricated for each of the 385 nm and the 400 nm chips. FIG. 9 illustrates the I-L characteristics of the 385 nm chips when current density is increased from 25.5 (A/cm$^2$) to 357.1 (A/cm$^2$). FIG. 10 illustrates the I-L characteristics of the 400 nm chips when current density is increased from 25.5 (A/cm$^2$) to 357.1 (A/cm$^2$).

Although a droop phenomenon is found in these I-L characteristics, all the chips show good characteristic results. In the droop phenomenon, the luminous efficiency decreases at high current density. In addition, when comparing the 385 nm chips and the 400 nm chips, the I-L characteristics are lower in the 400 nm chip than in the 385 nm chip. This is because the In composition in the light emitting layer (InGaN) is higher in the 400 nm chips than the 385 nm chips, and the 400 nm chips are inferior to the 385 nm chips in crystallinity of the light emitting layer. When the current density is low, the 400 nm chips offer high luminous efficiency due to unevenness of the In composition, but when carrier concentration increases with an increase in current density, the 400 nm chips are easily influenced by crystal defects inside the light emitting layer and by an increase in regions without emission recombination. Accordingly, a chip having a lower In composition has a lower rate of power output decrease relative to current density.

FIGS. 9 and 10 show that the chips having a square planar shape are superior in I-L characteristics to the chips having a rectangular shape. In addition, the figures show that the I-L characteristics are more linearly increased in the 385 nm chips than in the 400 nm chips.

Figure 11:
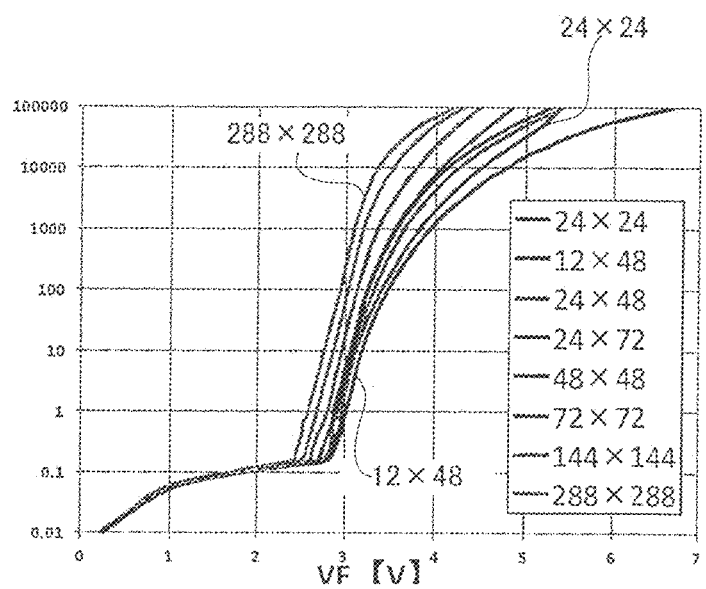
FIG. 11 illustrates I-V characteristics of the 385 nm chips according to the embodiment.
Figure 12:
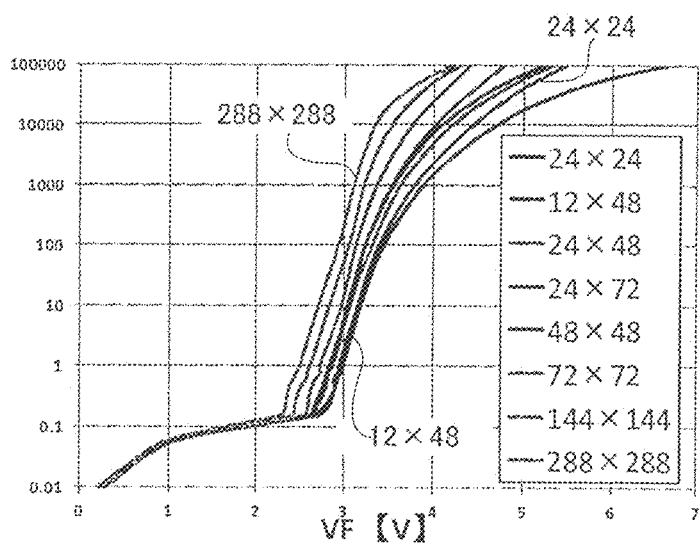
FIG. 12 illustrates I-V characteristics of the 400 nm chips according to the embodiment.

FIGS. 11 and 12 illustrate I-V characteristics when a current is applied to the chips of eight different sizes fabricated for each of the 385 nm and the 400 nm chips. FIG. 11 illustrates the I-V characteristics of the 385 nm chips, and FIG. 12 illustrates the I-V characteristics of the 400 nm chips. Leaks in low current regions are not found in either type of chip, and each chip exhibits normal I-V characteristics. In both types of chips, relatively small chips; that is, 24 µm×24 µm and 12 µm×48 µm, are compared with a relatively large chip; that is, 288 µm×288 µm. This comparison shows that voltage of the relatively smaller chips rises at a relatively small current. In addition, the comparison shows that the chips having a square planar shape are superior in I-V characteristics to the chips having a rectangular shape.

Figure 13:
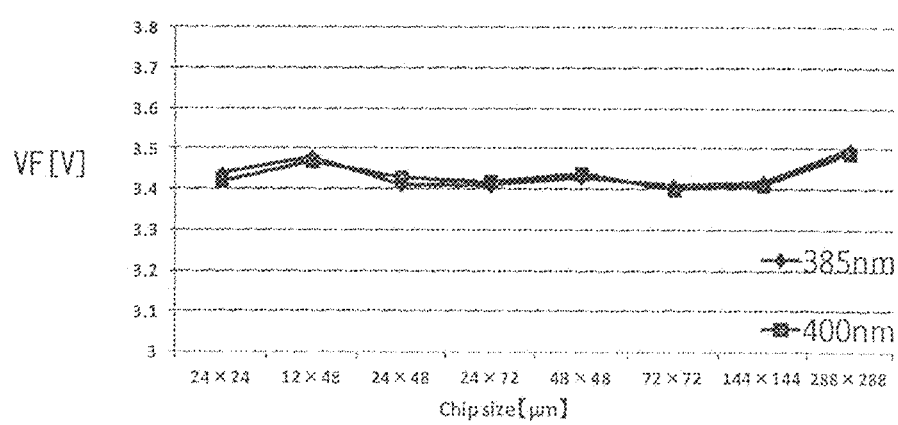
FIG. 13 illustrates VF characteristics of the 385 nm chips and the 400 nm chips according to the embodiment.

FIG. 13 illustrates VF (forward voltage) at 25.5 (A/cm$^2$) in chips of eight different sizes fabricated for each of the 385 nm and the 400 nm chips. The VF of each chip is 3.4 to 3.5 V.

In this manner, in a UV-LED chip having an emission wavelength of 385 nm and one having an emission wavelength of 400 nm, making the chip size small; specifically, forming the chip to have a quadrate planar shape with at least one side having a chip size of 50 µm or less, conspicuously improves the luminous intensity and luminous efficiency. More specifically, in a UV-LED chip having an emission wavelength of 385 nm, at least one side is preferably 30 µm or less, and in a UV-LED chip having an emission wavelength of 400 nm, at least one side is preferably 50 µm or less.

Furthermore, in UV-LEDs, the lower the In composition, the lower the rate of power output decrease with respect to current density. Accordingly, a chip having an emission wavelength of 385 nm has a lower rate of power output decrease with respect to current density than a chip having an emission wavelength of 400 nm. This fact indicates that a UV-LED with a lower In composition and a shorter emission wavelength than a 385 nm chip; for example, a UV-LED having an emission wavelength of 365 nm, has a much lower rate of power output decrease with respect to current density, and that the greater the reduction in chip size, the greater the improvement in luminous intensity and luminous efficiency. In short, a UV-LED with a lower In composition and a shorter emission wavelength has advantages as a display.

Figure 14:
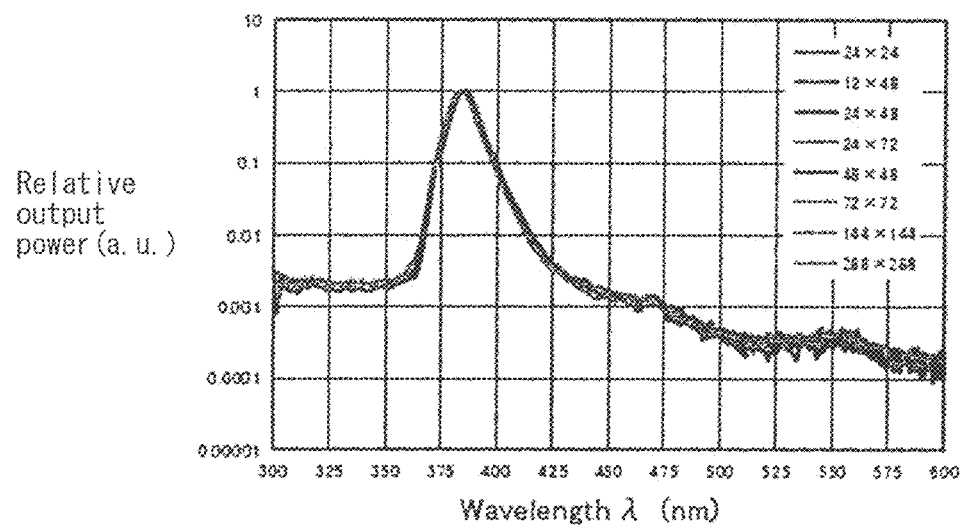
FIG. 14 illustrates a spectrum for each chip size of the 385 nm chip according to the embodiment.
Figure 15:
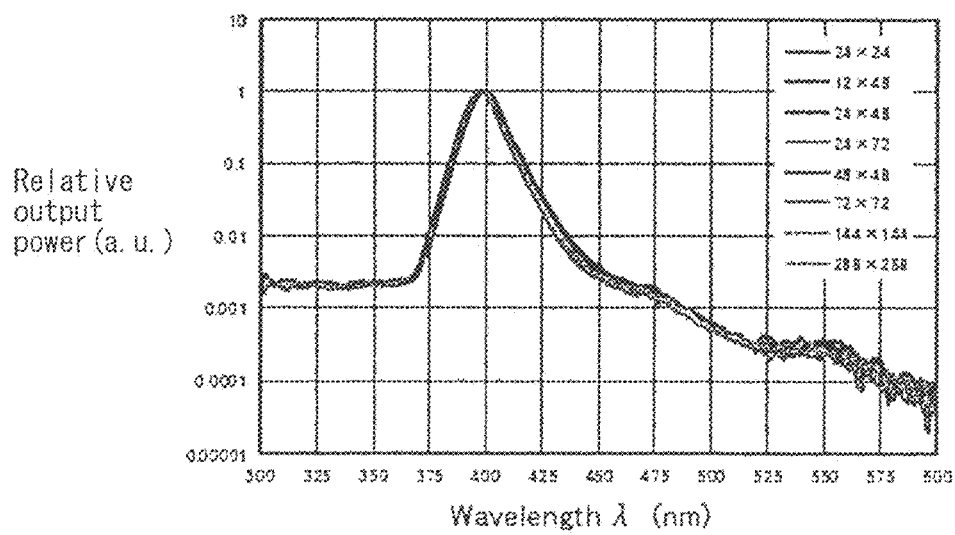
FIG. 15 illustrates a spectrum for each chip size of the 400 nm chip according to the embodiment.

FIG. 14 illustrates a spectrum for each chip size of the UV-LEDs having an emission wavelength of 385 nm. FIG. 15 illustrates a spectrum for each chip size of the UV-LEDs having an emission wavelength of 400 nm. Even when changing the chip sizes, no difference is found in the waveform in any of the UV-LEDs having an emission wavelength of 385 nm or 400 nm, and no difference is found in the luminous intensity of the deep level of each GaN layer around 500 nm to 500 nm. This result shows that an emission spectrum depends on crystallinity of an epitaxially grown layer and hardly depends on chip sizes and that even when reducing a chip size; specifically, even when forming a chip to have a quadrate planar shape with at least one side having a chip size of 50 µm or less, the chip emits light normally without problem.

Figure 16:
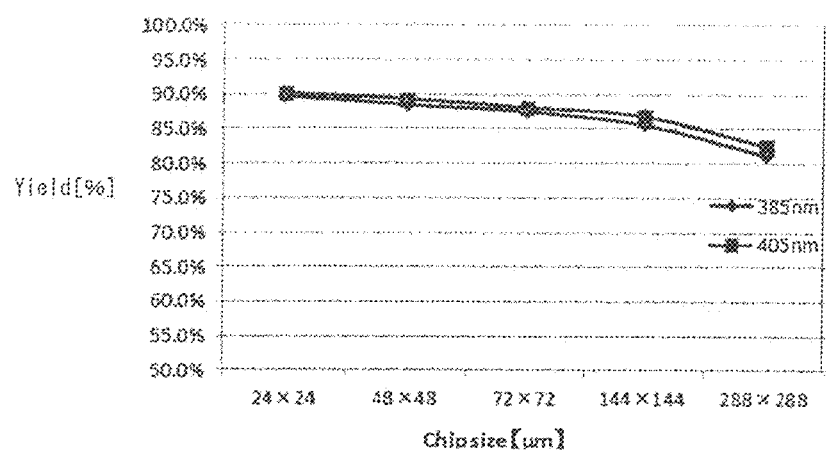
FIG. 16 illustrates yield for each chip size according to the embodiment.

FIG. 16 illustrates yield for each chip size of the UV-LEDs having an emission wavelength of 385 nm or 400 nm.

Five chips of different sizes, 24 µm×24 µm, 48 µm×48 µm, 72 µm×72 µm, 144 µm×144 µm, and 288 µm×288 µm, are prepared as the chips having a square shape. Among these chips, the number of products having good electrical characteristics and appearance are counted. FIG. 16 illustrates a rate of the good products to all chips. As shown in the figure, the yield improves with a reduction in the chip size. A possible reason for this result is that dust on a surface and an extraordinary epitaxial growth are about 50 µm at a maximum, but most of them are 50 µm or less and crystal defects are much smaller than 50 µm, which reduces the number of smaller-sized chips determined to be defective relative to the total number of chips. From a viewpoint of the yield, it is desirable to employ a UV-LED having a quadrate planar shape with at least one side having a chip size of 50 µm or less.

In the above embodiment, the flat sapphire substrate 20 is used as the UV-LED having an emission wavelength of 385 nm or 400 nm, but a patterned sapphire substrate (PSS) may also be employed instead of the flat sapphire substrate 20.

Figure 17A:
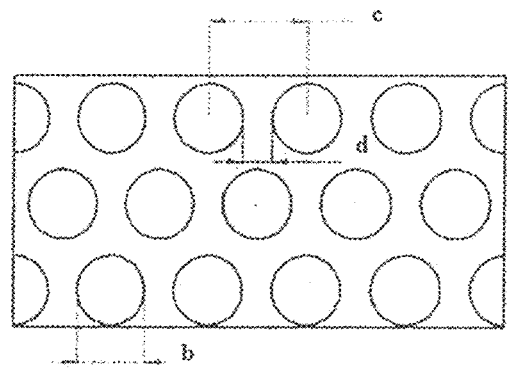
FIG. 17A and FIG. 17B each illustrate an arrangement of a PSS according to the embodiment.
Figure 17B:
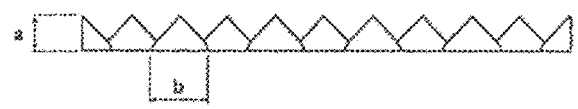

FIG. 17A and FIG. 17B each illustrate an arrangement of a PSS. FIG. 17A is a top view, and FIG. 17B is a side view. In each view, conical patterns are formed on a surface of a sapphire substrate. Each pattern has a height a=2.0 µm, a diameter b=3.75 µm, a pitch c=4.0 µm, and a space d=0.25 µm, but is not necessarily limited thereto. Patterns applied to a sapphire substrate reduce defect density of GaN crystals grown thereon and improve luminous efficiency of a light emitting layer. Furthermore, designing an optimum pattern shape enables efficient reflection of light emitted from a light emitting layer into an element to the outside of the element, which reduces internal losses of the light (rate at which the light changes to heat). A PSS is treated by forming a photoresist mask on a flat sapphire substrate and performing ICP dry etching.

Figure 18:
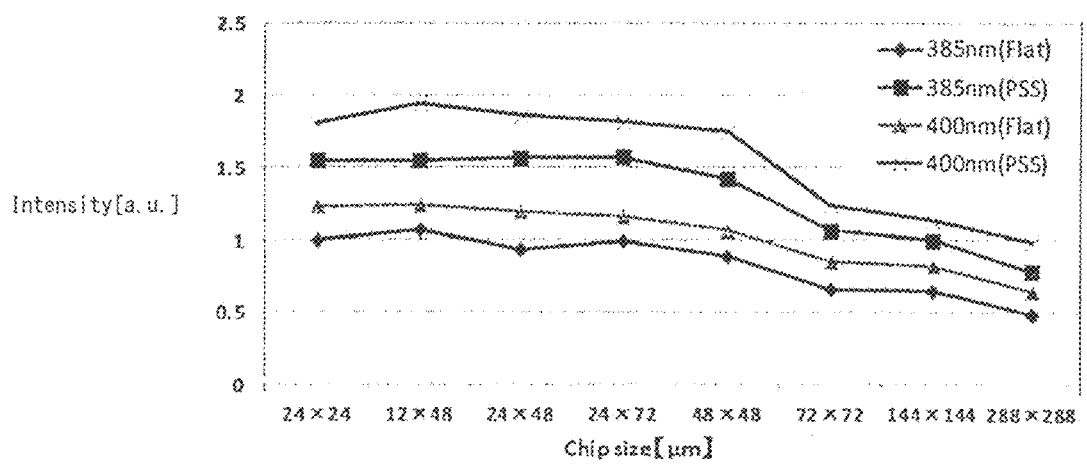
FIG. 18 illustrates a luminous intensity of each substrate according to the embodiment.

FIG. 18 illustrates luminous intensity of each chip size when the flat sapphire substrate and the PSS are used for UV-LEDs having an emission wavelength of 385 nm or 400 nm. The figure illustrates the luminous intensity when rated current density 25.5 A/cm$^2$ is applied to the UV-LEDs, and "Flat" represents the flat sapphire substrate, while "PSS" represents the patterned sapphire substrate. Focusing on the UV-LEDs having an emission wavelength of 385 nm, a chip with a smaller size has higher luminous intensity, and the luminous intensity increases in "PSS" than "Flat" in all chip sizes. Similarly, in the UV-LED having an emission wavelength of 400 nm, a chip with a smaller size has higher luminous intensity, and the luminous intensity increases in "PSS" than "Flat" in all chip sizes. Accordingly, using a PSS and setting the chip size to 50 µm or less causes more conspicuous improvement in luminous efficiency.

In this embodiment, UV-LEDs having an emission wavelength of 385 nm or 400 nm are exemplified. However, the emission wavelength may be changed by changing a composition ratio of a light emitting layer, and the changed emission wavelength is applicable to a UV-LED having an emission wavelength from about 385 nm to 400 nm. Although the minimum chip size of each UV-LED in this embodiment is 24 µm×24 µm, each UV-LED may have a chip size of about 10 µm×10 µm depending on manufacturing conditions, and such a UV-LED likewise offers improved luminous efficiency.

While micro LED displays for use as displays are attracting attention as next-generation displays, their luminous efficiency is not sufficient. In particular, no sufficient study has been conducted about characteristics of micro LEDs including an InGaN light emitting layer; a relationship between chip sizes and luminous efficiency is now being energetically studied.

It should be particularly noted that a relationship between the chip size of a micro LED including an InGaN light emitting layer and luminous efficiency is complicated; to achieve higher resolution displays, simple reduction in a chip size would not suffice. For example, a paper entitled "Electro-optical size-dependence investigation in GaN micro-LED device", Anis Daami et. al, 790/SID 2018 DIGEST, describes as follows:

The maximum external quantum efficiency is lowered in a non-negligible manner when the size decreases.

The optical current-density threshold shifts towards high current levels when the size decreases.

Drastic effect of µLED size reduction on external quantum efficiency is recognized when the size approaches sub-micron dimensions.

Droop need to be as low as possible to enhance µLED optical emission at high current levels.

When the current density is 10 A/cm$^2$, for example, the luminous intensity decreases as the chip size decreases from 500 µm, 50 µm, to 5 µm, µLED size effects on luminance and efficiency are important specifications to address, and issues to comprehend and optimize.

As described in the paper, a simple reduction in the chip size results in a decrease in the external quantum efficiency and a decrease in the luminous intensity. It has therefore been understood that a simple reduction in a chip size to achieve higher resolution lowers the luminous intensity and shifts the optical current-density towards high current levels, which makes it difficult to obtain sufficient luminance. The inventors have found that not only a simple reduction in a chip size but also introduction of an SLS layer may regulate a decrease in the luminous intensity and may further enable an increase in the luminous intensity with a decrease in a chip size. While it is known that SLS layers, which are known themselves, increase the external quantum efficiency of LEDs, effects of SLS layers on the chip size have not been recognized. The present embodiment first reveals effects of an SLS layer on a chip size, particularly a chip size of 50 µm or less.

Figure 19:
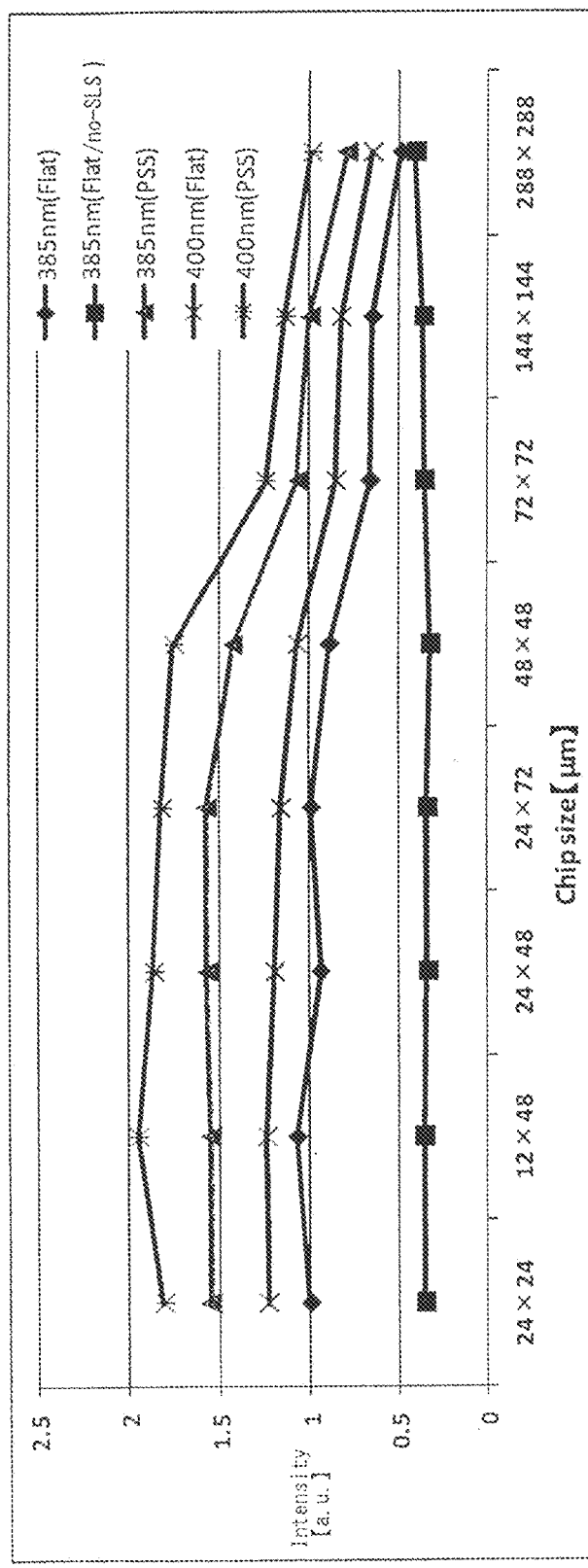
FIG. 19 illustrates a luminous intensity of each substrate according to the embodiment and a luminous intensity of each sample without an SLS layer.

FIG. 19 illustrates a relationship between luminous intensity and chip sizes of chips including chips without an SLS layer.

In FIG. 19, "385 nm (Flat/no-SLS)" is a sample having an emission wavelength of 385, and including a flat sapphire substrate and an InGaN light emitting layer disposed between a single layer of n-type clad layer (Al$_{0.1}$Ga$_{0.9}$N;Si 195 nm) which is not an SLS and a single layer of p-type clad layer (Al$_{0.1}$Ga$_{0.9}$N;Mg 22 nm) which is not an SLS. The remaining samples are the same as those shown in FIG. 18. The current density is 25.5 A/cm$^2$.

The samples including an n-type clad layer and a p-type clad layer but having no SLS structure tend to show luminous intensity that is decreased or substantially constant as the chip size decreases. In particular, in comparing samples having chip sizes of 72 µm×72 µm and 48 µm×48 µm having no SLS layer with those samples having an SLS layer, in the former samples without an SLS layer, the luminous intensity lowers with a decrease in size. In contrast, chips having a chip size of 50 µm or less with an SLS layer have an increased luminous intensity and show excellent characteristic which could not have been anticipated by those skilled in the art.

Causes of drastic differences in the chip sizes of 50 µm or less between presence and absence of an SLS layer are not necessarily clear. One possible explanation is as follows: in the absence of an SLS layer, a carrier density is reduced and a chip with a smaller size has a shorter distance of a diffusion current and therefore is more easily subjected to effects of a reduction in the carrier density, causing a decrease in emission recombination to lower luminous intensity, whereas presence of an SLS layer may effectively regulate these disadvantages.

In the absence of an SLS layer, the luminous intensity is lowered as the chip size decreases; therefore, micro LED devices having sufficient luminous efficiency cannot be obtained. Meanwhile, forming an n-type SLS layer and a p-type SLS layer with an InGaN light emitting layer interposed therebetween and setting the chip size to 50 µm or less increases the luminous efficiency. Thus, the UV-LED chip of the present embodiment accomplishes notable advantages which could not have been anticipated by those skilled in the art.

The invention claimed is:

1. A UV-LED comprising:
a buffer layer;
a contact layer formed on the buffer layer;
an n-type SLS layer formed on the contact layer;
an InGaN light emitting layer formed on the n-type SLS layer;
a p-type Mg-doped AlGaN layer formed on the InGaN light emitting layer; and
a p-type SLS layer formed on the p-type Mg-doped AlGaN layer,
wherein the UV-LED has a quadrate planar shape with at least one side having a chip size of 50 µm or less, and
wherein the UV-LED has an emission wavelength of 385 nm to 400 nm.

2. A display comprising:
the UV-LED according to claim 1;
a red phosphor excited by light from the UV-LED;
a green phosphor excited by light from the UV-LED; and
a blue phosphor excited by light from the UV-LED.

3. The UV-LED according to claim 1, further comprising:
a patterned sapphire substrate on which the buffer layer is formed.

4. The UV-LED according to claim 1,
wherein the chip size of the quadrate planar shape is any one of 24 µm×24 µm, 12 µm×48 µm, 24 µm×48 µm, 24 µm×72 µm, and 48 µm×48 µm.

5. The UV-LED according to claim 1, wherein the buffer layer includes a low-temperature u-GaN layer and a high-temperature u-GaN layer.

6. A display comprising:
the UV-LED according to claim 5;
a red phosphor excited by light from the UV-LED;
a green phosphor excited by light from the UV-LED; and
a blue phosphor excited by light from the UV-LED.

* * * * *